United States Patent [19]
Eid et al.

[11] Patent Number: 6,152,033
[45] Date of Patent: Nov. 28, 2000

[54] METHOD OF MAKING AN ELECTRONIC PRINTED STRUCTURE

[75] Inventors: Bernard Eid, Corning, N.Y.; Ronald E. Johnson, Tioga, Pa.

[73] Assignee: Corning Incorporated, Corning, N.Y.

[21] Appl. No.: 09/134,399

[22] Filed: Aug. 14, 1998

Related U.S. Application Data

[60] Provisional application No. 60/057,210, Aug. 29, 1997.

[51] Int. Cl.[7] .............................. B41M 1/10; B41M 1/34; H05K 3/12
[52] U.S. Cl. ........................ 101/170; 101/153; 101/488; 101/491
[58] Field of Search ..................... 101/170, 153, 101/150, 483, 488, 491; 65/17.3

[56] References Cited

U.S. PATENT DOCUMENTS

| | | | |
|---|---|---|---|
| 4,267,000 | 5/1981 | Dix et al. | 101/468 |
| 4,479,432 | 10/1984 | Masaki et al. | 101/170 |
| 4,566,384 | 1/1986 | Matsumoto | 101/150 |
| 5,127,330 | 7/1992 | Okazaki et al. | 101/450.1 |
| 5,174,925 | 12/1992 | Fujii et al. | 252/514 |
| 5,201,268 | 4/1993 | Yamamoto et al. | 101/170 |
| 5,514,503 | 5/1996 | Evans et al. | 430/7 |
| 5,544,582 | 8/1996 | Bocko et al. | 101/170 |
| 5,624,775 | 4/1997 | Carre et al. | 101/170 |
| 5,678,483 | 10/1997 | Johnson | 101/153 |
| 5,693,375 | 12/1997 | Sato et al. | 427/522 |
| 5,849,082 | 12/1998 | Stefani | 101/170 |
| 5,853,446 | 12/1998 | Carre et al. | 65/17.3 |

FOREIGN PATENT DOCUMENTS 5-147359  6/1993  Japan.

*Primary Examiner*—John S. Hilten
*Assistant Examiner*—Leslie J. Grohusky
*Attorney, Agent, or Firm*—Maurice M. Klee; Scott S. Servilla

[57] ABSTRACT

A method of printing electrode and electronic circuit patterns. A metal frit containing part is transferred from an intaglio recessed imaging pattern to a suitable substrate. The frit pattern is preferably cured during deposition to the substrate.

6 Claims, 3 Drawing Sheets

METHOD OF MAKING AN ELECTRONIC PRINTED STRUCTURE

This application claims the benefit of U.S. Provisional Application, Serial No. 60/057,210, filed Aug. 29, 1997 entitled METHOD OF MAKING A PLANARIZING LAYER FOR A FLAT PANEL DISPLAY, by Bernard Eid and Ronald E. Johnson.

FIELD OF THE INVENTION

This invention relates to a method of printing fine patterns. More specifically, the invention relates to a printing method suitable for forming, with high precision and moreover on a quantity-production scale, fine patterns of, for example, electrodes or fine electrical circuits and elements to be supplied for electronic components.

BACKGROUND OF THE INVENTION

In recent years, printing techniques such as screen printing and offset printing have been adopted to print electronic circuits. These printing processes having been suitable for forming patterns of relatively wide (200 $\mu$m or more) printing elements (lines). However they have not been suited to the formation of fine patterns of printing areas of less width. Moreover, these prior techniques have been accompanied by problems such as deformation of printed patterns due to causes such as the effect of the fluidity of the ink and the pressure of the printing plate and remnant ink on the printing plate and not being transferred onto the object being printed. As a consequence, the reproducibility of the printed pattern has been poor. For example, by the screen printing process, printing is carried out by forming on a mesh-form screen an ink-shielding mask so that the non-masked parts of this mask form a desired pattern and causing ink to pass through the non-masked parts and adhere to the object being printed (hereinafter referred to as print object). Using the width of printing elements (lines) for practical use is limited to about 60 $\mu$m.

Consequently, using these prior art printing methods, it has been difficult to form fine patterns less than 60 microns. Moreover, reproducibility of the printed pattern has been inadequate using these techniques. Accordingly, in order to form fine electronic patterns (e.g. electrodes for plasma display panels), it has been necessary to resort to photolithography. Formation of very fine patterns is possible by photolithography. In comparison with printing processes, however, photolithographic processes involve complicated process steps, low productivity, and high cost.

One application where extremely fine printed patterns are required is in electrode and electronic circuit patterns such as is employed in electronic information displays, (e.g. electrodes for plasma displays) as well as hybrid optoelectro components. Such electronic patterns, which are on the order of less than 60 microns in width, are typically formed via photolithographic techniques. It would be desirable to develop alternative techniques for forming fine accurate printed patterns onto substrates.

SUMMARY OF THE INVENTION

The present invention relates to a method and apparatus for forming electrode structures or electronic circuit structures, for example those which are used in electronic information display panel applications, such as liquid crystal or plasma displays. In one embodiment of the invention, a recessed pattern, such as an intaglio plate, corresponding to a desired electrode structure is contacted with a formable conductive frit containing material to form an electrode structure suitable for a plasma display on a suitable substrate. For example, in one embodiment, an intaglio plate is filled with a conductive frit containing material and the frit containing material is transferred to a substrate.

Conductive frit containing materials, as used herein, means a material containing conductive material in particulate form such as, for example, an organic carrier medium in which is dispersed one or more particulate metal materials. Typically, these conductive particulate materials are contained in particle sizes less than 15 microns, preferably less than 10 microns, and most preferably between about 3 and 7 microns. Preferred conductive frit materials include silver, nickel, copper or palladium metals. These conductive materials are chosen to flow and sinter when heated. The cohesiveness of the conductive frit containing material must be sufficient that it retains the shape of the recessed pattern once it is deposited or formed on the glass. Consequently, the conductive frit containing material is preferably solidified while still retained within the recessed pattern, so that it retains the shape of the recessed pattern. In a preferred embodiment, at least some and preferably all of the hardening or solidification of the conductive frit containing material occurs during the transfer to the substrate.

Preferred thermoplastic carrier materials include plasticized thermoplastic polybutylmethacrylate polymers blended with waxes, such as fatty alcohol waxes. Alternatively, the binder can be a blend of plasticized thermoplastic polymers with methacrylate or acrylate monomers. In the latter case, just sufficient methacrylate or acrylate monomer is employed to retain the shape upon transferring and in subsequent firing. The methacrylate monomers are preferred to minimize carbonaceous residue upon binder removal. The thermoplastic polymer is generally polybutylmethacrylate and the plasticizers can be selected from any commonly employed plasticizers such as dialkyl phthalates, alkyl alcohols, and so forth. During binder removal the plasticizers are selected to volatilize prior to pyrolysis of the cross-linked methacrylate network.

In one embodiment, a conductive frit which is dispersed within an organic carrier material is deposited within the Intaglio recessed pattern. Then, while the carrier and frit materials are retained within the recessed pattern, the frit containing material is hardened, such as by drying, cooling, reacting (cross-linking, such as by thermal, photochemical (radiation cure) or other cross-linking means), or other means, depending on what organic carrier material is utilized. Hardening these materials while they are retained within the recessed pattern enables the materials to retain the shape of the recessed pattern as much as possible. Such hardening preferably takes place simultaneous with deposition to the substrate.

For example, the conductive frit containing material may be hardened simultaneous with transfer of the material to the suitable substrate using radiation curable or other curable materials. This can be achieved, for example, by employing radiation curable material as the carrier, and curing the material by emitting radiation through the glass substrate and into the carrier material while it is retained within the recessed pattern and during the deposition of the material to the substrate. Preferred radiation curable materials include UV curable acrylate or methacrylate monomers, with the methacrylate being preferred. Again to minimize carbonaceous residue upon firing it is desirable to have a significant quantity of non-reactive thermoplastic acrylic resins, waxes, plasticizers, etc, the cross-linkable monomers being kept at a level just sufficient for retaining the shape upon transfer and firing.

After the frit containing material has been successfully deposited onto the substrate, the organic material is preferably burned out by heating the resulting composite to a temperature sufficient to volatilize or burn off any organic material and sinter the frit material, thereby leaving a conductive metal pattern to the intaglio produced frit pattern.

Using the methods of the present invention, applicants have successfully formed monolithic electrode structures suitable for use as the electrodes for the front and back plates in plasma display applications, or optoelectronic switches. Compared to the prior art methods for forming electrodes, the present invention is simpler and is thought to facilitate the formation of accurate electrode structures. The present invention enables the formation of extremely accurate structures, for example, which are 5 microns wide by 1,000 microns long by 1 micron high. For example, electrodes 20 to 60 microns wide by 1 meter long by 10 microns high have been achieved.

DETAILED DESCRIPTION OF THE INVENTION

Figure 1A:
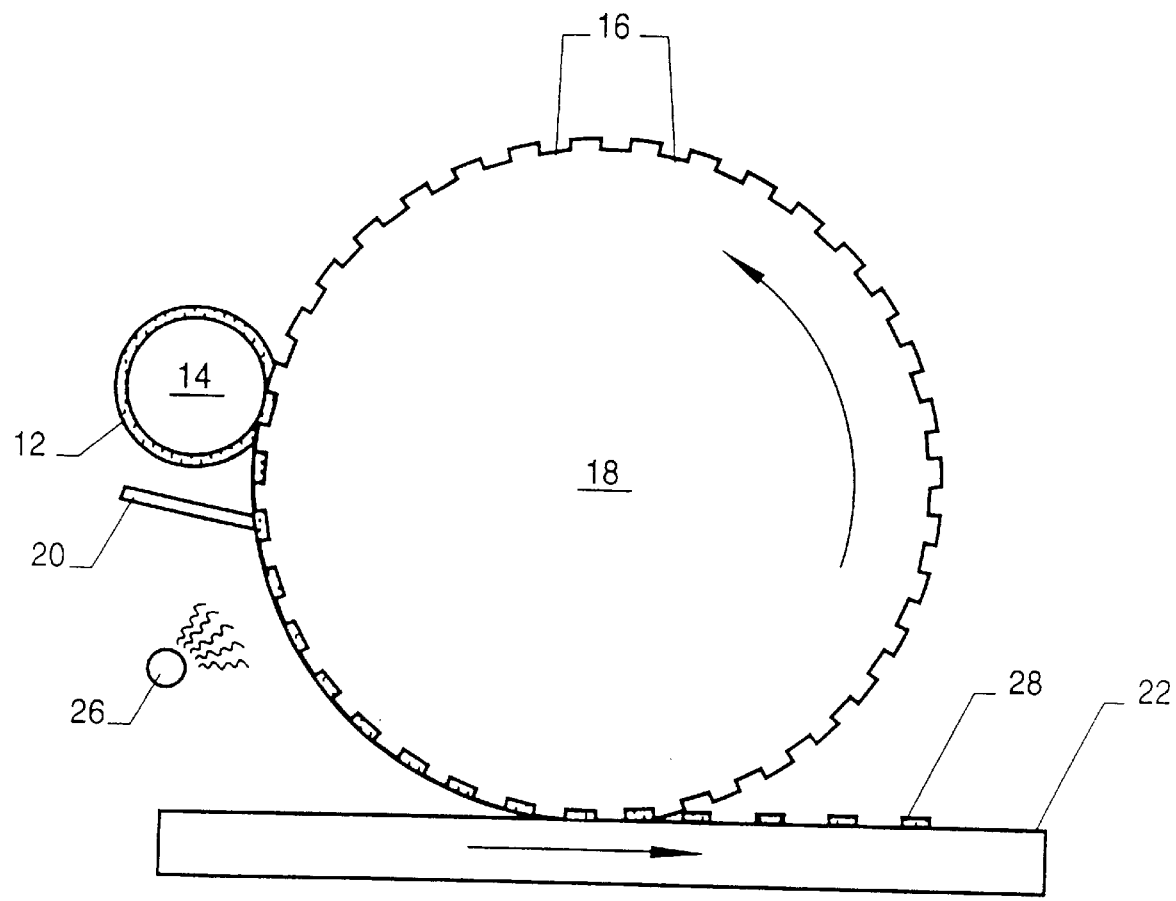
FIGS. 1A and 1B illustrate an apparatus for depositing an electrode structure, for use in a flat panel display, onto a glass substrate.

FIG. 1 illustrates deposition of an electrode pattern suitable for use in plasma display panels. In FIG. 1, conductive frit containing material 12 is deposited from applicator roll 14 onto recessed surface 16 of intaglio roll 18. Recessed pattern 16 corresponds to a desired pattern for an electrode pattern for a plasma display panel. After deposition into recessed pattern 16, excess conductive frit containing material 12 is removed from the recess by doctor blade 20. Preferred frit containing materials include silver paste, nickel paste or palladium paste.

Figure 1B:
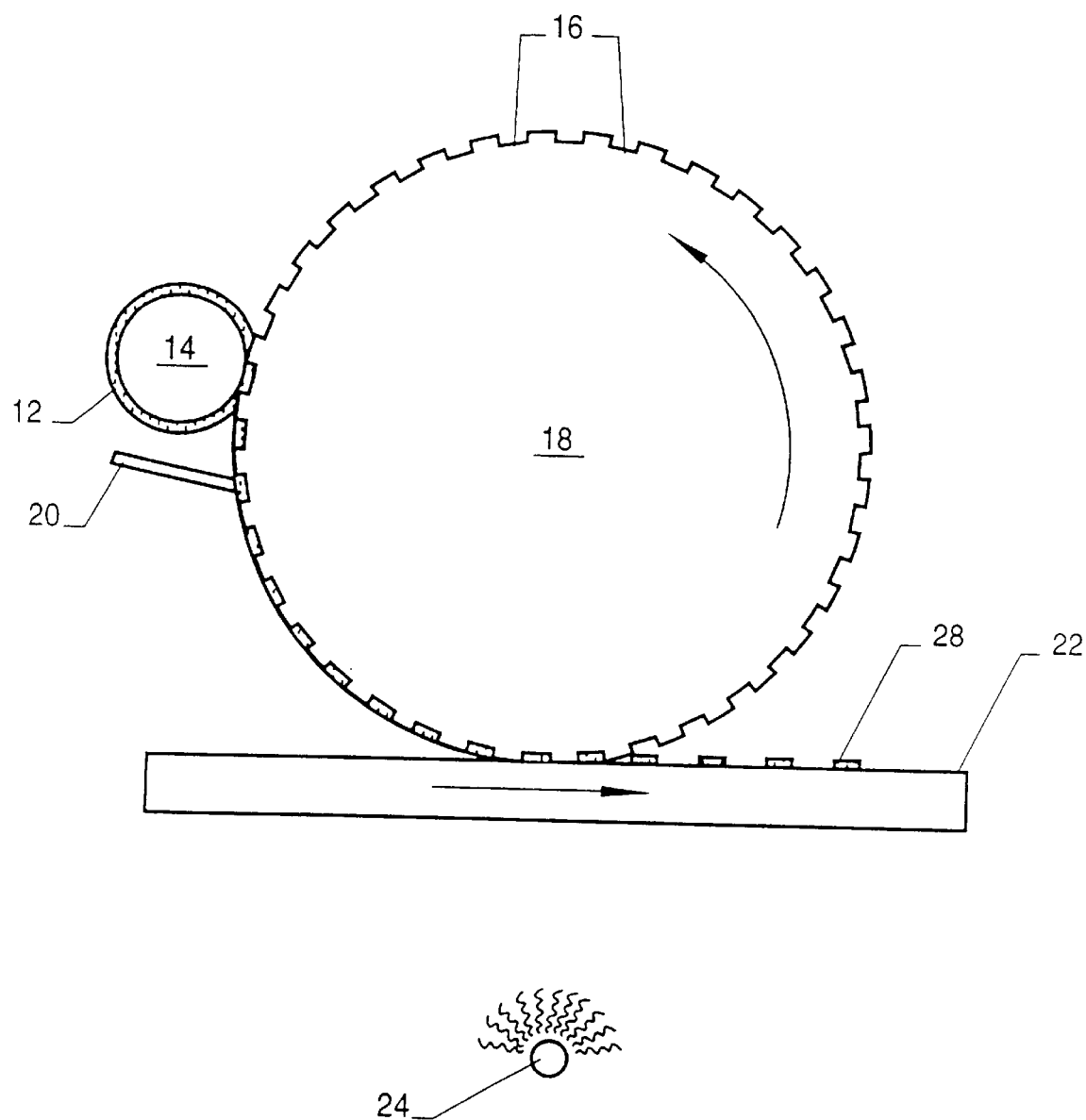

In the embodiment illustrated in FIG. 1, the conductive frit containing material 12 is deposited onto a suitable substrate 22, which preferably is a glass sheet. The frit material should preferably develop sufficient cohesiveness while retained within the recessed pattern 16 to retain the shape of the recessed pattern 16. Preferably, to facilitate this result, the glass frit containing material is hardened prior to (FIG. 1A) or during (FIG. 1B) deposition to the substrate 22. For example, in the most preferred embodiment, the carrier for the glass frit material is curable via UV radiation and the material 12 is cured via UV light 24 simultaneous with deposition of the frit containing material to the substrate 22. Substrate 22 is transparent to the UV radiation emitted by UV light 24, thereby allowing the radiation to travel through substrate 22 and cure the organic carrier for the glass frit containing material 12. Of course such radiation curing could be achieved by other means, e.g., by emitting radiation from a suitable radiation source (not shown) at the nip between roll 18 and the substrate 22.

In another embodiment, the glass frit containing material 12 is hardened or cured prior to being deposited to the substrate 22, such as, for example, by UV light 26. In such cases, prior to transfer of the frit containing material 12 to the substrate 22, it may be desirable to apply an adhesive layer either to the substrate or the glass frit containing material. The adhesive can be a tacky pressure sensitive adhesive which adheres to the substrate upon applying pressure, or it can be formulated to cure upon contact. In the later case, use of a radiation curable adhesive is preferred. It is often desirable that the adhesive layer also contain frit to facilitate adhesion retention upon binder removal and ultimate post-fired adhesion between the electronic structures and the glass substrate. It may also be desirable that this frit be a lower melting frit to enhance post-fired adhesion. The adhesive used can be, for example, a material selected from the group consisting of polyimides, epoxides, acrylics, vinyl ethers, polyurethanes, polyesters, acrylated or methacrylated acrylics, esters, urethanes, and epoxides, or mixtures thereof. Plasticized polyalkylmethacrylate polymers are generally preferred due to advantages in binder removal. If a reactive adhesive is desired these are generally blended with polyfunctional methacrylate monomers, photoinitiators, and so forth.

The intaglio imaging surface should preferably be more releasing than the adhesive used to transfer the hardened glass frit containing material 12 to the glass substrate 22. Material disposed within intaglio and gravure imaging plates typically has a negative meniscus, the surface of the material in the recessed pattern curving below the imaging plate surface. Consequently, the adhesive layer must be sufficiently soft and tacky to contact and adhere to the cured or hardened glass frit containing material 12 and remove the material from the recesses of the intaglio imaging pattern.

The use of an adhesive may only be necessary where a negative meniscus results, such as is the case where the glass frit containing material is hardened by drying. The shrinkage for such materials is usually higher than for cured or cooled material shrinkage. However, if the intaglio groove is filled by means other than doctoring and if the material is not solidified by drying, it may be possible to avoid the negative meniscus and therefore transfer without needing the transfer adhesive. For example, ink can be deposited into the grooves by typography, a squeegee, roll coating orifice extrusion and so forth, so that the meniscus in the intaglio grooves could be positive, or alternatively so that a thin continuous film layer covers the surface of the intaglio pattern plate.

After the conductive frit containing material has been transferred to the glass substrate 22, the substrate and conductive frit 12 are fired at a temperature sufficient to burn off any organic materials present, as well as to consolidate the conductive frit containing material 12, while still maintaining the structural integrity of the material. Using the methods described herein, dense, fully fused, homogeneous free-standing metal electrode structures of high quality have been achieved which are suitable for use as electrode or electronic circuits in electronic display applications.

Figure 2:
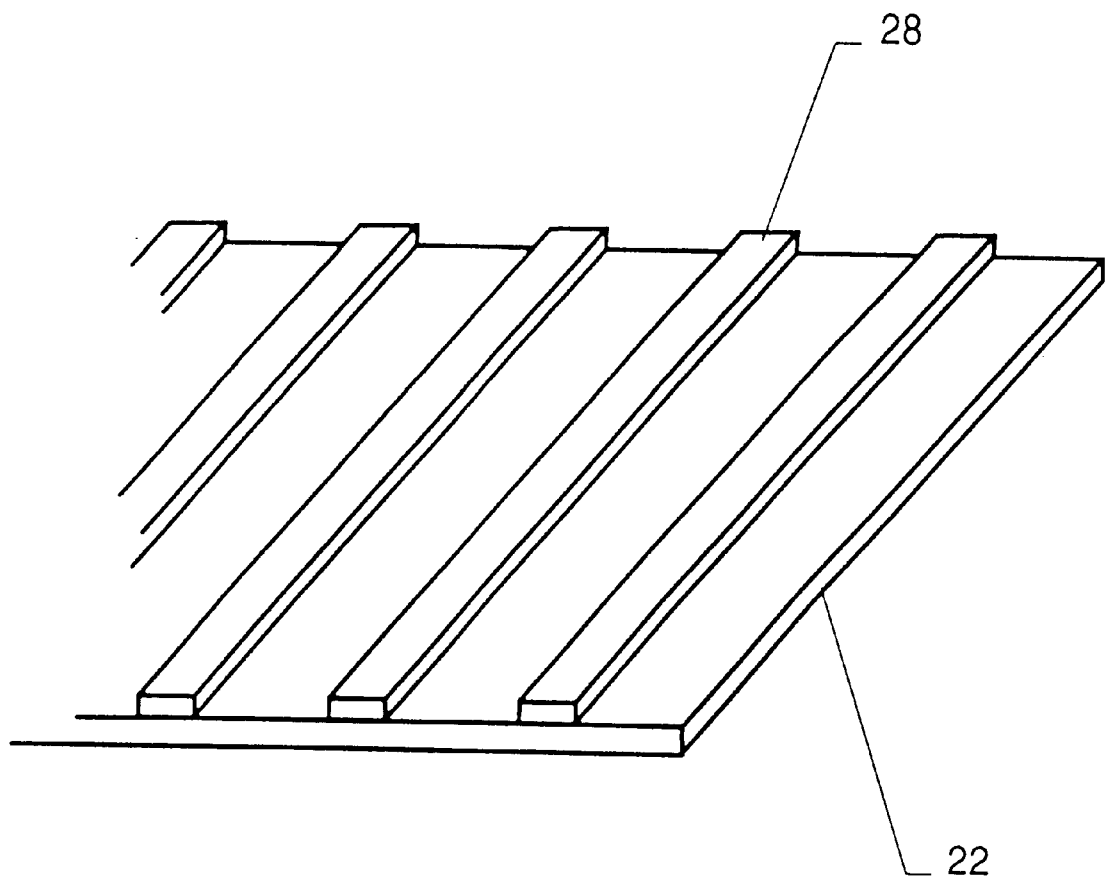
FIG. 2 illustrates an electrode structure for use in a flat panel display formed in accordance with the invention.

FIG. 2 illustrates a resultant structure formed by depositing glass frit containing material 12 onto substrate 22. The electronic structure illustrated in FIG. 2 comprises parallel electrodes 28 for use in a plasma flat panel display. Alternatively, other shapes and designs of electrode or electronic circuits can be achieved.

The organic carrier for the conductive frit containing material 12 may consist of, for example, a wax, a binder in solvent, a binder in wax, a binder in plasticizer, which may further contain a radiation curable oligomer or monomer. In a preferred embodiment, radiation curable materials are employed as the organic carrier for the conductive frit containing material 12.

Although the invention has been described in detail for the purpose of illustration, it is understood that such detail is solely for that purpose and variations can be made therein by those skilled in the art without departing from the spirit and scope of the invention which is defend by the following claims.

What is claimed is:

1. A method of making an electronic printed structure, comprising:

depositing a frit comprised of electrically conductive material from an intaglio recessed pattern to a substrate, and simultaneous with said depositing, curing said frit.

2. The method of claim 1, wherein said curing step comprises curing said frit via radiation.

3. The method of claim 1, wherein said curing comprises emitting said radiation through said substrate.

4. The method of claim 1, wherein said electrically conductive material comprises a metal selected from the group consisting of silver, nickel, copper and palladium.

5. The method of claim 1, further comprising heating said frit and substrate to a temperature sufficient to sinter said frit to an electrically conductive metal pattern.

6. The method of claim 3, further comprising heating said frit and substrate to a temperature sufficient to sinter said frit to an electrically conductive metal pattern.

* * * * *